Nov. 13, 1962 G. STRULL 3,063,879

CONFIGURATION FOR SEMICONDUCTOR DEVICES

Filed Feb. 26, 1959

INVENTOR
Gene Strull
BY
Frederick Shapoe
ATTORNEY

United States Patent Office 3,063,879
Patented Nov. 13, 1962

3,063,879
CONFIGURATION FOR SEMICONDUCTOR DEVICES

Gene Strull, Greensburg, Pa., assignor to Westinghouse Electric Corporation, East Pittsburgh, Pa., a corporation of Pennsylvania Filed Feb. 26, 1959, Ser. No. 795,700
3 Claims. (Cl. 148—33)

This invention is concerned with a novel geometric configuration for semiconductor devices such as transistors.

Heretofore in preparing a semiconductor device such as a junction transistor, the practice has been to apply to one surface of a semiconductor wafer an emitter of relatively small area and a base ring surrounding the emitter, and to apply to the opposite surface of the wafer a relatively large collector, but less than the area of such opposite surface. However, in such construction there are relatively extensive unutilized areas of the collector. Furthermore, there are other drawbacks as will be described subsequently.

An object of the present invention is to provide a semiconductor device in which a collector is coextensive with one surface of a semiconductor wafer and an emitter is disposed close to the periphery of a second opposing surface of the semiconductor wafer.

Another object of the present invention is to provide a semiconductor device which makes a maximum utilization of a given collector applied to a transistor device by applying the emitter in a substantially ring-shaped form to the opposite surface.

Other objects of this invention will in part be obvious and will in part appear hereinafter.

For a better understanding of the nature and objects of the invention, reference should be had to the following detailed description and drawing, in which.

In accordance with the present invention and attainment of the foregoing objects there is provided a junction semiconductor device comprising in combination, a first semiconductor element or wafer having two flat parallel surfaces, the element being of a first type of semiconductivity, a second element of a second type semiconductivity, which serves as a collector, disposed upon and coextensive with one of said surfaces of said first semiconductor element, a semiconductor transition region or P-N junction between said first and second element, a third element having the same semiconductivity as said second element and serving as an emitter of substantially ring-shaped form disposed closely adjacent to the periphery of a second opposing surface of the first semiconductor element, a second semiconductor transition region or P-N junction between said third and said first element, and a base contact disposed centrally within the third element upon said second surface of said first semiconductor element.

For purposes of a better understanding of the teachings of this invention, it will be described in terms of preparing a germanium semiconductor device having an n-type semiconductivity wafer or element. It will be understood that the teaching of the invention is applicable in a similar manner to devices prepared from silicon, silicon carbide, silicon germanium alloys and other semiconductor materials both p-type and n-type as well as germanium.

Figure 1:
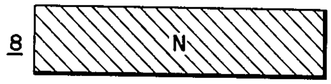
FIGURES 1 and 2 are two views in cross section illustrating one method of preparing a semiconductor device incorporating the teachings of this invention.

Referring now to FIG. 1, there is illustrated a single crystal first semiconductor element or wafer 8 having two substantially flat parallel surfaces, comprised of germanium doped with an n-type impurity, for example, arsenic.

Figure 2:
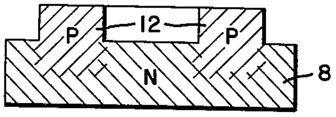

As illustrated in FIG. 2, a second semiconductor element 12 of p-type semiconductivity is then formed upon one surface of 8 by alloying or diffusing a p-type doping pellet, an evaporated layer, a foil or the like of substantially circular or ring-shaped configuration to the upper surface and adjacent the periphery of the n-type wafer 8. Examples of suitable p-type doping materials include aluminum, indium, gallium, and alloys thereof, for example, gallium-indium and the like. Care should be exercised in forming the p-type element 12 to assure that the doping material does not penetrate completely through wafer 8.

Figure 3:
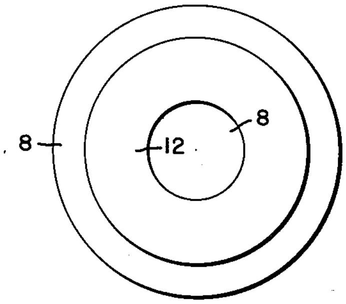
FIG. 3 is a top plan view of the device of FIG. 2.

With reference to FIG. 3, there is illustrated a top view of the device of FIG. 2 showing the p-type semiconductive element 12 circularly disposed adjacent the periphery of the n-type semiconductor wafer 8.

Figure 4:
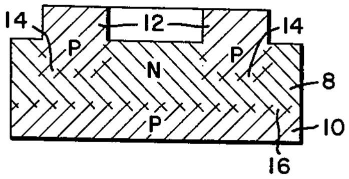
FIGS. 4, 5 and 6 are a series of views in cross section illustrating one method of preparing a semiconductor device incorporating the teachings of this invention.

Thereafter, as illustrated in FIG. 4, a third semiconductor element 10 of a p-type semiconductivity is disposed upon the entire bottom surface of the wafer 8. This third element may be formed from the same materials as is element 12 and forms a junction with element 8 by alloying or diffusing.

A semiconductor transition region 14 exists at the interface of element 12 and element 8 and a second semiconductor transition region 16 exists at the interface of element 10 and element 8. The semiconductor transition regions 14 and 16 are p-n junctions.

Figure 5:
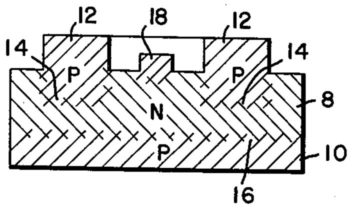

As illustrated in FIG. 5, a base contact 18, comprised of any suitable material such as lead and tin or antimony alloys of lead and tin and the like is disposed centrally upon the upper surface of element 8. The contact 18 may be backed with steel, cast iron, nickel, and the like to increase the rigidity of the member.

Figure 6:
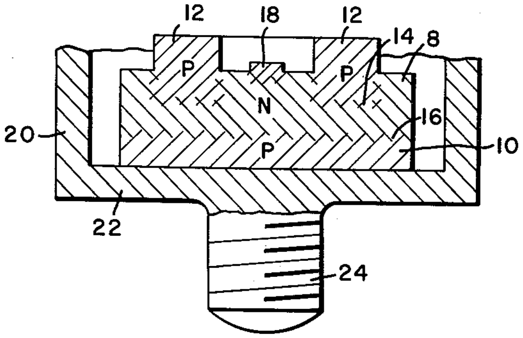

In FIG. 6, there is illustrated the device of FIG. 5 affixed to a casing 20. This is accomplished by soldering of the element 10 to the casing 20 at the lower face 22. A threaded stud 24 forms a part of casing 20 and serves both as an electrical contact and a heat dissipating connection to a heat sink which enables cooling of the transistor. Examples of suitable solders which may be used include pure indium, lead-tin, indium-tin alloy and the like. Examples of suitable materials of which the heat sink may be comprised include, for example, aluminum, copper and steel.

Figure 7:
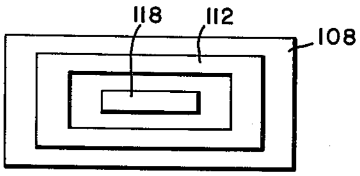
FIG. 7 is a top plan view of a semiconductor device of a modified design incorporating the teaching of this invention.

The semiconductor device prepared as described above and illustrated in views 1 to 6 is of circular configuration. However, the teachings of this invention are equally applicable to devices of rectangular or other configuration. In FIG. 7 there is illustrated a top view of a semiconductor device employing the teachings of this invention which is of rectangular configuration. In FIG. 7 a base element 108 has a rectangular or window-shaped emitter 112 disposed adjacent the periphery of one surface thereof and a base contact 118 disposed substantially centrally upon the same surface thereof. A collector (not shown) is coextensive with the other surface of element 108.

Figure 8:
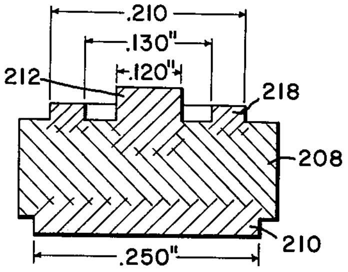
FIG. 8 is a side view in cross section of a semiconductor device of conventional prior art design.

With reference to FIG. 8, there is shown a semiconductor device having the orthodox or prior art configuration in which element 208 is a base element, element 210 is a collector and element 212 is an emitter. A base contact 218 is disposed upon one surface of the base element 208 about the emitter 212.

Figure 9:
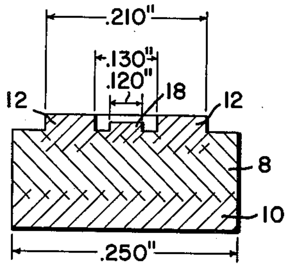
FIG. 9 is a side view in cross section of a semiconductor device to set forth the advantages of the teachings of this invention.

With reference to FIG. 9, there is shown a semiconductor device having the configuration of this invention. Element 8 is a base element, element 10 is a collector element, element 12 is an emitter element and 18 is a base contact.

From FIGS. 8 and 9 the similarity in configuration and dimensions can be readily seen. However, the advantage of employing the configuration of this invention is set forth in table form below.

*Table*

| | Orthodox design | Design of this invention |
|---|---|---|
| Emitter Area | 0.0113 inch.² | 0.0214 inch.² |
| Collector Area Utilized | 0.0154 inch.² | 0.0322 inch.² |
| Maximum Distance Between The Base and Any Point of Emitter. | 0.065 inch. | 0.045 inch. |

In the configuration of this invention, it can be seen that for the same size semiconductor unit the emitter area and utilized collector area is approximately doubled and the distance between the emitter and collector has been decreased. These improvements are very substantial.

While the invention has been described with particular embodiments and examples, it will be understood, of course, that modifications, substitutions and the like may be made therein without departing from its scope.

I claim as my invention:

1. A semiconductor device comprising in combination, a first semiconductor element of a first-type of semiconductivity, said first element having two substantially flat parallel surfaces, a single second element of a second type semiconductivity, which serves as a collector, disposed upon and coextensive with one of said surfaces of said first semiconductor element, a semiconductor transition region between said first and second element, a single third element having the same semiconductivity as said second element and serving as an emitter disposed upon the second surface of the first semiconductor element adjacent to the periphery of the second surface of the first semiconductor element, a second semiconductor transition region between said third and said first element, and a single base contact disposed centrally upon said second surface of said first semiconductor element and entirely within the area enclosed by the single emitter element.

2. A semiconductor device comprising in combination, a first semiconductor element of n-type semiconductivity and comprised of a semiconductive material selected from the group consisting of silicon, germanium and silicon carbide, said first element having two substantially flat, parallel surfaces, a single second semiconductor element of p-type semiconductivity, which serves as a collector and is comprised of the same type of semiconductive material as said first element, disposed upon and coextensive with one of said surfaces of said first semiconductor element, a p-n junction between said first and second elements, a single third semiconductor element of p-type semiconductivity, which serves as an emitter and is comprised of the same type of semiconductive material as said first element, disposed upon the second surface of the first semiconductor element adjacent to the periphery of the second surface of the first semiconductor element, a second p-n junction between said first and third semiconductor elements, and a single base contact disposed centrally upon said second surface of said first semiconductor element and entirely within the area enclosed by the single emitter element.

3. A semiconductor device comprising in combination, a first semiconductor element of p-type semiconductivity and comprised of a semiconductive material selected from the group consisting of silicon, germanium and silicon carbide, said first element having two substantially flat parallel surfaces, a single second semiconductor element of n-type semiconductivity, which serves as a collector and is comprised of the same type of semiconductive material as said first element, disposed upon and coextensive with one of said surfaces of said first semiconductor element, a p-n junction between said first and second elements, a single third semiconductor element of n-type semiconductivity, which serves as an emitter and is comprised of the same type of semiconductive material as said first element, disposed upon the second surface of the first semiconductor element adjacent to the periphery of the second surface of the first semiconductor element, a second p-n junction between said first and third semiconductor elements, and a single base contact disposed centrally upon said second surface of said first semiconductor element and entirely within the area enclosed by the single emitter element.

References Cited in the file of this patent

UNITED STATES PATENTS

| | | |
|---|---|---|
| 2,744,970 | Shockley | May 8, 1955 |
| 2,709,232 | Thedrick | May 24, 1955 |
| 2,748,041 | Leverenz | May 29, 1956 |
| 2,754,431 | Johnson | July 10, 1956 |
| 2,879,188 | Strull | Mar. 24, 1959 |
| 2,893,904 | Dickson | July 7, 1959 |
| 2,910,653 | Pritchard | Oct. 29, 1959 |
| 2,922,897 | Maupin | Jan. 26, 1960 |
| 2,923,870 | Zelinka | Feb. 2, 1960 |
| 2,924,760 | Herlet | Feb. 9, 1960 |